US010855437B1

(12) United States Patent
Chen et al.

(10) Patent No.: US 10,855,437 B1
(45) Date of Patent: Dec. 1, 2020

(54) CLOCK DATA RECOVERY APPARATUS AND OPERATION METHOD THEREOF

(71) Applicants: Faraday Technology Corporation, Suzhou (CN); Faraday Technology Corp., Hsinchu (TW)

(72) Inventors: Ling Chen, Hsinchu (TW); Andrew Chao, Hsinchu (TW); Xiao-Dong Fei, Hsinchu (TW); Wei Liu, Hsinchu (TW)

(73) Assignees: FARADAY TECHNOLOGY CORPORATION, Suzhou (CN); Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 16/583,234

(22) Filed: Sep. 25, 2019

(30) Foreign Application Priority Data

Jul. 4, 2019 (CN) .......................... 2019 1 0599161

(51) Int. Cl.
*H04L 7/033* (2006.01)
*H03L 7/08* (2006.01)

(52) U.S. Cl.
CPC ............ *H04L 7/033* (2013.01); *H03L 7/0807* (2013.01); *H04L 7/0331* (2013.01); *H04L 7/0334* (2013.01); *H04L 7/0337* (2013.01); *H04L 7/0338* (2013.01)

(58) Field of Classification Search
CPC ..... H04L 7/033; H04L 7/0331; H04L 7/0334; H04L 7/0337; H04L 7/0338
See application file for complete search history.

(56) References Cited

U.S. PATENT DOCUMENTS

| 5,633,899 A * | 5/1997 | Fiedler | .................. | H03L 7/0891 331/1 A |
| 5,790,613 A * | 8/1998 | Tateishi | .................. | H04L 7/033 375/317 |
| 6,731,683 B1 * | 5/2004 | Fiedler | .................. | H04L 7/0058 375/232 |

(Continued)

FOREIGN PATENT DOCUMENTS

TW    201526629    7/2015

OTHER PUBLICATIONS

"Office Action of Taiwan Counterpart Application," dated Nov. 13, 2019, p. 1-p. 5.

*Primary Examiner* — Thomas J. Hiltunen
(74) *Attorney, Agent, or Firm* — Winston Hsu

(57) ABSTRACT

The present invention provides a clock data recovery apparatus and an operation method thereof. The clock data recovery apparatus includes an equalizer, a phase detector, a charge pump, and an oscillation circuit. The equalizer is configured to equalize raw data to generate equalized data. The phase detector is coupled to the equalizer to receive the equalized data. The phase detector is configured to generate a detection result according to the equalized data. The phase detector performs pattern-filtering on the equalized data to filter out at least one pattern. The charge pump is coupled to the phase detector to receive the detection result. The charge pump is configured to generate a control signal according to the detection result. The oscillation circuit is coupled to the charge pump to receive the control signal. The oscillation circuit is configured to generate a clock signal according to the control signal.

27 Claims, 10 Drawing Sheets

(56) References Cited

U.S. PATENT DOCUMENTS

| | | | |
|---|---|---|---|
| 6,788,484 B2* | 9/2004 | Honma | G11B 20/10009 |
| | | | 360/27 |
| 7,099,400 B2* | 8/2006 | Yang | H03L 7/087 |
| | | | 375/287 |
| 7,577,193 B2* | 8/2009 | Goth | H03L 7/0805 |
| | | | 333/18 |
| 7,609,102 B2* | 10/2009 | Shanbhag | H03D 13/003 |
| | | | 327/12 |
| 7,822,113 B2* | 10/2010 | Tonietto | H03L 7/0807 |
| | | | 327/166 |
| 8,379,711 B2 | 2/2013 | Aziz et al. | |
| 8,457,269 B2* | 6/2013 | Chang | H04L 7/033 |
| | | | 327/148 |
| 9,077,349 B2* | 7/2015 | Kong | H03L 7/07 |
| 9,160,582 B1* | 10/2015 | Huss | H04L 25/03885 |
| 9,236,869 B2* | 1/2016 | Hata | H03L 7/07 |
| 9,237,004 B2* | 1/2016 | Lin | H03L 7/087 |
| 9,325,489 B2* | 4/2016 | Hsieh | H04L 7/0334 |
| 9,385,859 B2 | 7/2016 | Kuan et al. | |
| 10,225,069 B2* | 3/2019 | Rahman | H03L 7/087 |
| 10,305,704 B1* | 5/2019 | Kenyon | H04L 25/03057 |
| 10,411,593 B1* | 9/2019 | Abramzon | H03K 21/16 |
| 2013/0223505 A1 | 8/2013 | Cohen et al. | |
| 2020/0098330 A1* | 3/2020 | Pyun | G06F 1/08 |

* cited by examiner

CLOCK DATA RECOVERY APPARATUS AND OPERATION METHOD THEREOF

CROSS-REFERENCE TO RELATED APPLICATION

This application claims the priority benefit of China application serial no. 201910599161.X, filed on Jul. 4, 2019. The entirety of the above-mentioned patent application is hereby incorporated by reference herein and made a part of this specification.

BACKGROUND OF THE INVENTION

1. Field of the Invention

The present invention relates to a clock data recovery (referred to as CDR hereinafter) apparatus and an operation method thereof.

2. Description of Related Art

Usually, when a Bang-Bang CDR apparatus performs locking by using edge information, impacts of inter-symbol interference (ISI) on an edge is not eliminated or decreased. Generally, the inter-symbol interference impacts a locking capability of the CDR, and increases a jitter of a recovery clock.

SUMMARY OF THE INVENTION

The present invention provides a clock data recovery (CDR) apparatus and an operation method thereof, to decrease impacts of inter-symbol interference (ISI) on an edge of data and improve a capability of the clock data recovery apparatus for resisting against inter-symbol interference.

According to an embodiment of the present invention, the clock data recovery apparatus includes an equalizer, a phase detector, a charge pump, and an oscillation circuit. The equalizer is configured to equalize raw data to generate equalized data. The phase detector is coupled to the equalizer to receive the equalized data. The phase detector is configured to generate a detection result according to the equalized data. The phase detector performs pattern-filtering on the equalized data to filter out at least one pattern. The charge pump is coupled to the phase detector to receive the detection result. The charge pump is configured to generate a control signal according to the detection result. The oscillation circuit is coupled to the charge pump to receive the control signal. The oscillation circuit is configured to generate a clock signal according to the control signal.

According to an embodiment of the present invention, an operation method for a clock data recovery apparatus includes: equalizing, by an equalizer, raw data to generate equalized data; generating, by a phase detector, a detection result according to the equalized data, where the phase detector performs pattern-filtering on the equalized data to filter out at least one pattern; generating, by a charge pump, a control signal according to the detection result; and generating, by an oscillation circuit, a clock signal according to the control signal.

According to an embodiment of the present invention, the clock data recovery apparatus includes an equalizer, a phase detector, a charge pump, and an oscillation circuit. The equalizer is configured to equalize raw data to generate equalized data. The equalizer equalizes the raw data based on a loop-unrolling structure by using a first equilibrium coefficient, to generate current data of the equalized data; the equalizer equalizes the raw data based on the loop-unrolling structure by using a second equilibrium coefficient, to generate first edge data of the equalized data; the equalizer equalizes the raw data by using the first equilibrium coefficient, to generate error data of a difference between the equalized data and a reference signal; the equalizer updates the first equilibrium coefficient by using the current data and the first edge data; and the equalizer updates the second equilibrium coefficient by using the current data and the error data. The phase detector is coupled to the equalizer to receive the equalized data. The phase detector is configured to generate a detection result according to the equalized data. The charge pump is coupled to the phase detector to receive the detection result. The charge pump is configured to generate a control signal according to the detection result. The oscillation circuit is coupled to the charge pump to receive the control signal. The oscillation circuit is configured to generate a clock signal according to the control signal.

According to an embodiment of the present invention, an operation method for a clock data recovery apparatus includes: equalizing, by the equalizer, raw data based on a loop-unrolling structure by using a first equilibrium coefficient, to generate current data of equalized data; equalizing, by the equalizer, the raw data based on the loop-unrolling structure by using a second equilibrium coefficient, to generate first edge data of the equalized data; equalizing, by the equalizer, the raw data by using the first equilibrium coefficient, to generate error data of a difference between the equalized data and a reference signal; updating, by the equalizer, the first equilibrium coefficient by using the current data and the error data; updating, by the equalizer, the second equilibrium coefficient by using the current data and the error data; generating, by a phase detector, a detection result according to the equalized data; generating, by a charge pump, a control signal according to the detection result; and generating, by an oscillation circuit, a clock signal according to the control signal.

Based on the foregoing descriptions, in some embodiments, the phase detector may perform pattern-filtering on data (to filter out a specific pattern having serious inter-symbol interference) and may generate a detection result according to the data. Therefore, the clock data recovery apparatus and the operation method thereof may decrease impacts of the inter-symbol interference on an edge of data and may improve a capability of the clock data recovery apparatus for resisting against the inter-symbol interference. In some other embodiments, the equalizer may update a second equilibrium coefficient by using current data and error data (a difference between current data and a reference signal), and may equalize raw data based on a loop-unrolling structure by using the second equilibrium coefficient. Therefore, the equalizer may adaptively adjust an equilibrium coefficient based on an amplitude, to equalize raw data.

BRIEF DESCRIPTION OF THE DRAWINGS

Accompanying drawings are included to further understand the present invention, and the accompanying drawings are incorporated into the specification and constitute a part of the specification. The accompanying drawings describe the embodiments of the present invention, and together with the descriptions, are used to explain principles of the present invention.

DESCRIPTION OF THE EMBODIMENTS

Figure 1:
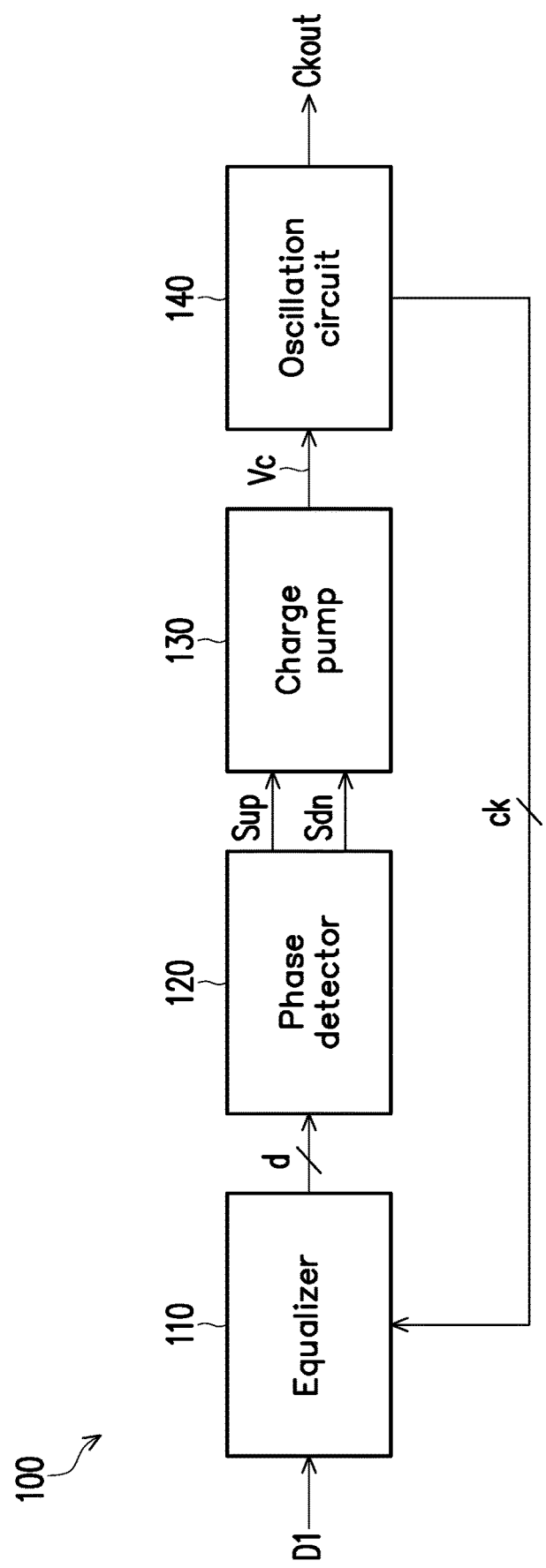
FIG. 1 is a schematic circuit block view a of a clock data recovery (CDR) apparatus drawn according to an embodiment of the present invention.

Descriptions are made in the accompanying drawings with reference to exemplary embodiments of the present invention and examples of the exemplary embodiments in detail. If possible, same reference numerals of elements are used to indicate same or similar parts in the accompanying drawings and descriptions.

FIG. 1 is a schematic circuit block view a of a clock data recovery (referred to as CDR hereinafter) apparatus 100 drawn according to an embodiment of the present invention. In an embodiment shown in FIG. 1, the CDR apparatus 100 includes an equalizer 110, a phase detector 120, a charge pump 130, and an oscillation circuit 140. The equalizer 110 may equalize and sample raw data D1 according to a clock signal ck provided by the oscillation circuit 140, to generate equalized data d. The phase detector 120 is coupled to the equalizer 110 to receive the equalized data d. The phase detector 120 may generate a detection result according to the equalized data d, where the detection result includes a detection result Sup and a detection result Sdn. This embodiment does not limit implementations of the equalizer 110 and the phase detector 120. The charge pump 130 is coupled to the phase detector 120 to receive the detection result Sup and the detection result Sdn. The charge pump 130 may generate a control signal Vc according to the detection result Sup and the detection result Sdn. This embodiment does not limit an implementation of the charge pump 130. According to design requirements, in some embodiments, the charge pump 130 may include a commonly known charge pump circuit or anther charge pump circuit. The oscillation circuit 140 is coupled to the charge pump 130 to receive the control signal Vc. The oscillation circuit 140 may generate a clock signal CKout and a clock signal ck according to the control signal Vc. An implementation of the oscillation circuit 140 may be determined according to design requirements. For example, the oscillation circuit 140 may include a voltage controlled oscillator, a voltage controlled delay line, or another oscillation circuit. The voltage controlled oscillator and the voltage controlled delay line are commonly known circuits, and therefore, the descriptions thereof are omitted herein.

Figure 2:
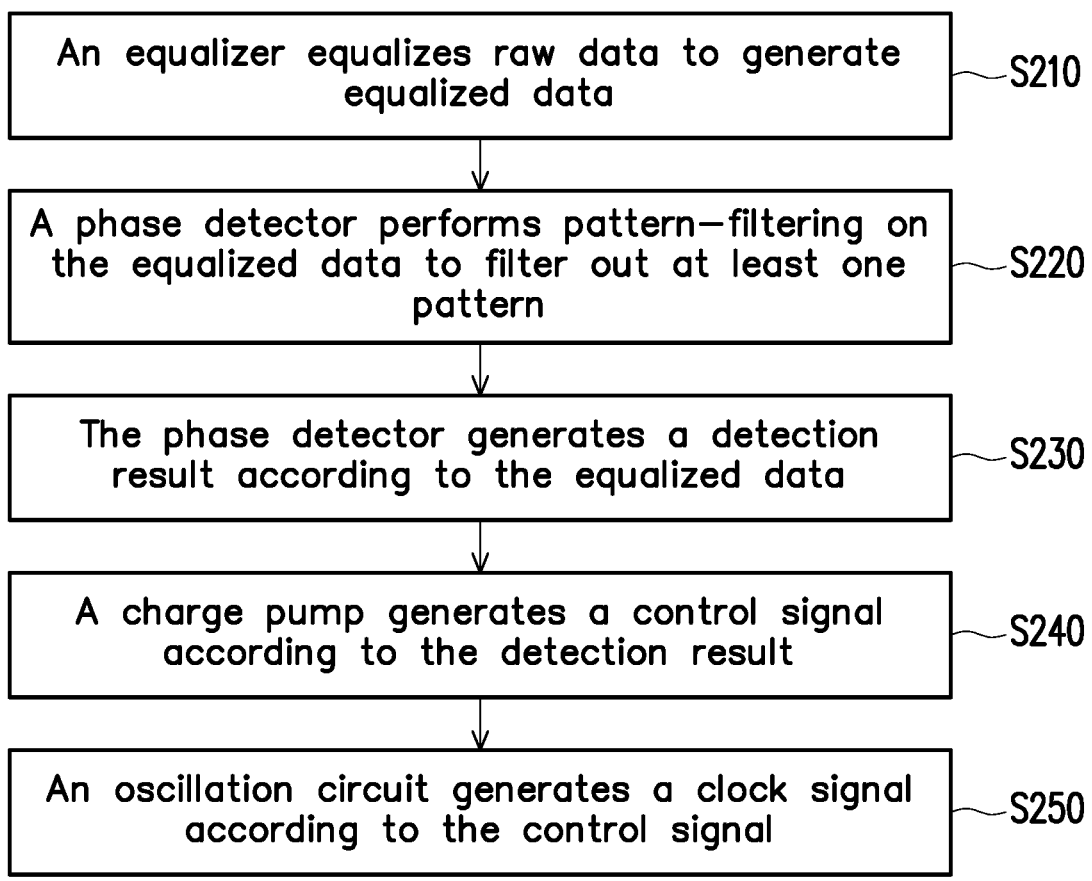
FIG. 2 is a schematic flowchart of an operation method for a CDR apparatus drawn according to an embodiment of the present invention.

FIG. 2 is a schematic flowchart of an operation method for a CDR apparatus drawn according to an embodiment of the present invention. Refer to FIG. 1 and FIG. 2. In step S210, an equalizer 110 may equalize and sample raw data D1 according to a clock signal ck provided by an oscillation circuit 140, to generate equalized data d. In step S220, a phase detector 120 may perform pattern-filtering on the equalized data d to filter out at least one pattern. A pattern filtered out by the phase detector 120 may be set according to design requirements. Generally speaking, the pattern filtered out by the phase detector 120 may be a specific pattern having serious inter-symbol interference (ISI). In step S230, the phase detector 120 may generate a detection result (for example, a detection result Sup and a detection result Sdn) according to the equalized data d. In step S240, the charge pump 130 may generate a control signal Vc according to a detection result Sup and a detection result Sdn. In step S250, the oscillation circuit 140 may generate a clock signal CKout and a clock signal ck according to the control signal Vc.

This embodiment does not limit an implementation of performing pattern-filtering by the phase detector 120. For example, in this embodiment, the phase detector 120 may calculate the following equation (1) to obtain the detection result Sup, and may calculate following equation (2) to obtain the detection result Sdn. ^ is an exclusive OR (or XOR) operand, * is an AND operand, | is an OR operand, d[n] indicates current data of the equalized data d, d[n−1] indicates a previous first piece of data of the equalized data d, d[n−2] indicates a previous second piece of the equalized data d, d[n−3] indicates a previous third piece of data of the equalized data d, d[n−5/2] indicates edge data of the equalized data d between the previous second piece of data d[n−2] and the previous third piece of data d[n−3], and tf[0], tf[1] and tf[2] indicate different bits of a pattern selection signal tf. The pattern selection signals tf may be set according to design requirements. The pattern selection signals tf may control a length of a pattern.

$$Sup=(d[n-5/2]\textasciicircum d[n-3])*(tf[0]|(d[n-3]\textasciicircum d[n-2]))*(tf[1]|(d[n-2]\textasciicircum d[n-1]))*(tf[2]|(d[n-1]\textasciicircum d[n])) \quad \text{Equation (1)}$$

$$Sdn=(d[n-2]\textasciicircum d[n-5/2])*(tf[0]|(d[n-3]\textasciicircum d[n-2]))*(tf[1]|(d[n-2]\textasciicircum d[n-1]))*(tf[2]|(d[n-1]\textasciicircum d[n])) \quad \text{Equation (2)}$$

Based on the foregoing descriptions, the phase detector 120 may perform pattern-filtering on data d (to filter out a specific pattern having serious inter-symbol interference) and may generate the detection result Sup and the detection result Sdn according to the data d. Therefore, the CDR apparatus 100 may decrease impacts of the inter-symbol interference on an edge of the data and may improve a capability of the CDR apparatus 100 for resisting against the inter-symbol interference.

Figure 3:
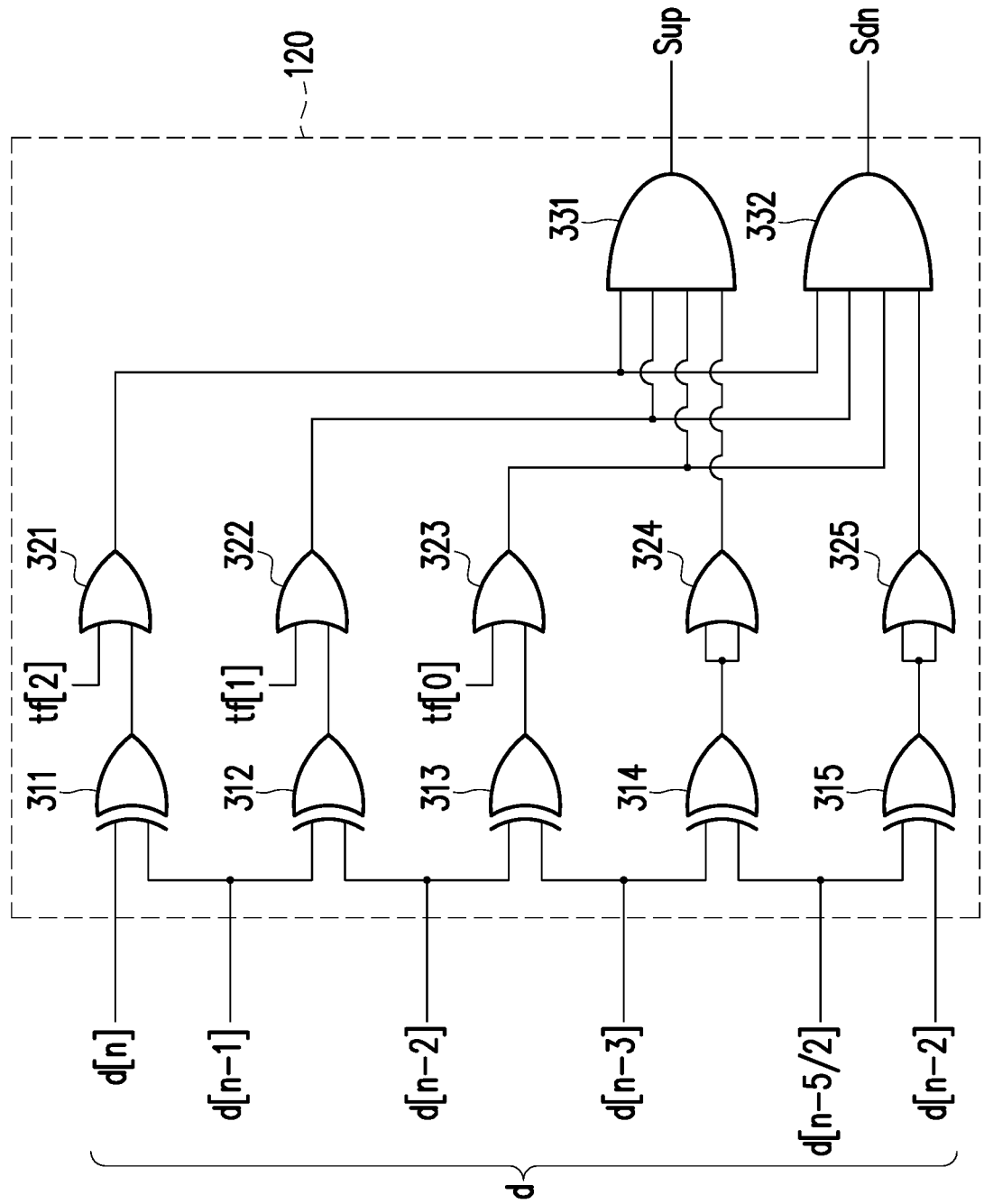
FIG. 3 is a schematic circuit block view for describing a phase detector shown in FIG. 1 according to an embodiment of the present invention.

FIG. 3 is a schematic circuit block view for describing the phase detector 120 shown in FIG. 1 according to an embodiment of the present invention. In an embodiment shown in FIG. 3, the equalized data d includes current data d[n], a previous first piece of data d[n−1], a previous second piece of data d[n−2], a previous third piece of data d[n−3], and edge data d[n−5/2], and the phase detector 120 includes an XOR gate 311, an XOR gate 312, an XOR gate 313, an XOR gate 314, an XOR gate 315, an OR gate 321, an OR gate 322, an OR gate 323, an OR gate 324, an OR gate 325, an AND gate 331, and an AND gate 332. A first input terminal of the XOR gate 311 is coupled to the equalizer 110 to receive the current data d[n] of the equalized data d. A second input terminal of the XOR gate 311 and a first input terminal of the XOR gate 312 are coupled to the equalizer 110 to receive the previous first piece of data d[n−1] of the equalized data d. A second input terminal of the XOR gate 312, a first input terminal of the XOR gate 313 and a second input terminal of the XOR gate 315 are coupled to the equalizer 110 to receive the previous second piece of data d[n−2] of the equalized data d. A second input terminal of the XOR gate 313 and a first input terminal of the fourth XOR gate 314 are coupled to the equalizer 110 to receive the previous third piece of data d[n−3] of the equalized data d. A second input terminal of the XOR gate 314 and a first input terminal of the XOR gate 315 are coupled to the equalizer 110 to receive edge data d[n−5/2] of the equalized data d between the previous second piece of data d[n−2] and the previous third piece of data d[n−3].

A first input terminal of the OR gate 321 receives a first bit tf[2] of the pattern selection signal tf. A second input terminal of the OR gate 321 is coupled to an output terminal of the XOR gate 311. A first input terminal of the OR gate 322 receives a second bit tf[1] of the pattern selection signal tf. A second input terminal of the OR gate 322 is coupled to an output terminal of the XOR gate 312. A first input terminal of the OR gate 323 receives a third bit tf[0] of the pattern selection signal tf. A second input terminal of the OR gate 323 is coupled to an output terminal of the XOR gate 313. A first input terminal and a second input terminal of the OR gate 324 are coupled to an output terminal of the XOR gate 314. A first input terminal and a second input terminal of the OR gate 325 are coupled to an output terminal of the XOR gate 315. A first input terminal of the AND gate 331 and a first input terminal of the AND gate 332 are coupled to an output terminal of the OR gate 321. A second input terminal of the AND gate 331 and a second input terminal of the AND gate 332 are coupled to an output terminal of the OR gate 322. A third input terminal of the AND gate 331 and a third input terminal of the AND gate 332 are coupled to an output terminal of the OR gate 323. A fourth input terminal of the AND gate 331 is coupled to an output terminal of the OR gate 324. An output terminal of the AND gate 331 outputs the detection result Sup. A fourth input terminal of the AND gate 332 is coupled to an output terminal of the OR gate 325. An output terminal of the AND gate 332 outputs the detection result Sdn.

Figure 4:
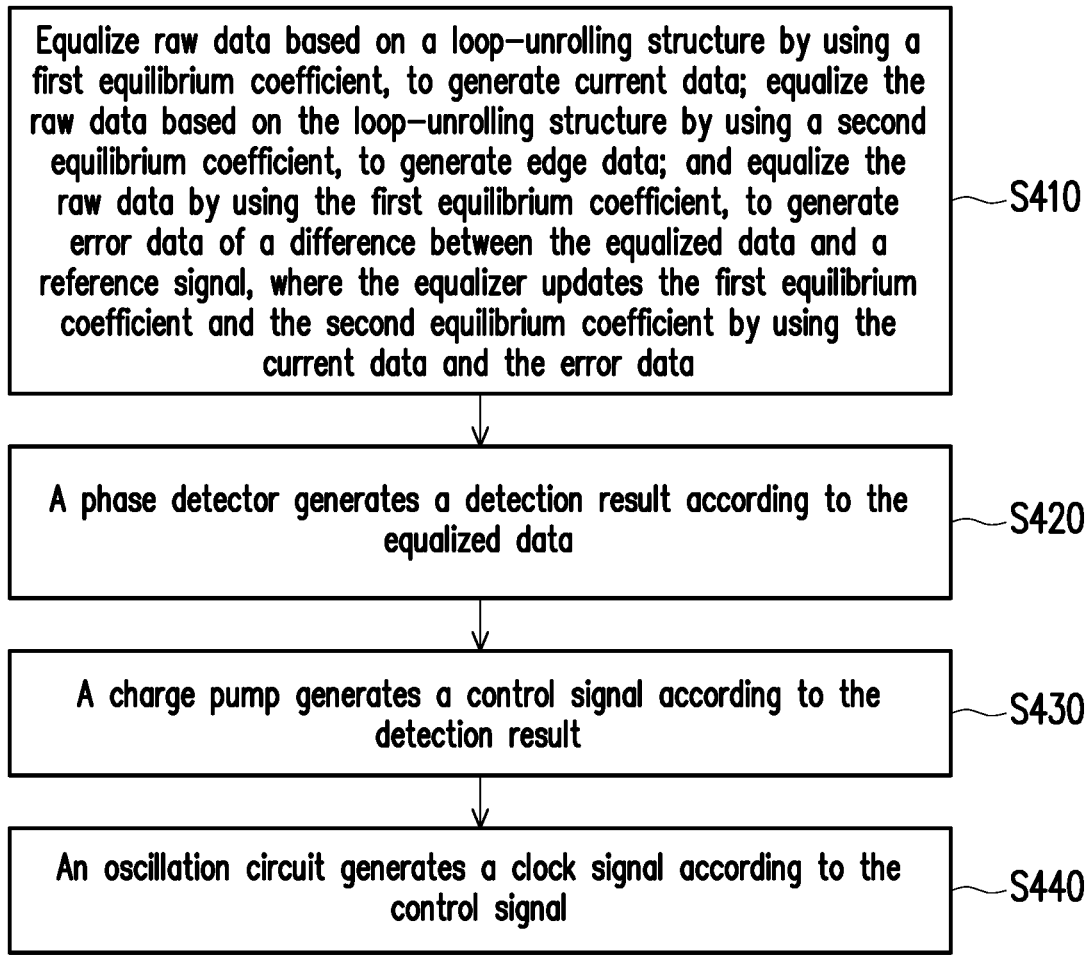
FIG. 4 is a schematic flowchart of an operation method for a CDR apparatus drawn according to another embodiment of the present invention.

FIG. 4 is a schematic flowchart of an operation method for a CDR apparatus drawn according to another embodiment of the present invention. Refer to FIG. 1 and FIG. 4. In step S410, an equalizer 110 may equalize and sample the raw data D1 based on a loop-unrolling structure by using a first equilibrium coefficient α<1>, to generate current data d[n] of the equalized data d. In step S410, the equalizer 110 may equalize and sample the raw data D1 based on the loop-unrolling structure by using a second equilibrium coefficient α<0.5>, to generate edge data d[n−5/2] of the equalized data d. In step S410, the equalizer 110 may equalize the raw data D1 based on the loop-unrolling structure by using the first equilibrium coefficient α<1>, to generate error data err[n] of a difference between the equalized data d and a reference signal Vref. In step S410, the equalizer 110 may update the first equilibrium coefficient α<1> by using the current data d[n] and the error data err[n]. In step S410, the equalizer 110 may update the second equilibrium coefficient α<0.5> by using the current data d[n] and the error data err[n]. In step S420, a phase detector 120 may generate a detection result (for example, a detection result Sup and a detection result Sdn) according to the equalized data d. In step S430, a charge pump 130 may generate a control signal Vc according to the detection result Sup and the detection result Sdn. In step S440, an oscillation circuit 140 may generate a clock signal CKout and a clock signal ck according to the control signal Vc.

Based on the foregoing descriptions, the equalizer 110 may update the second equilibrium coefficient α<0.5> by using current data d[n] and error data err[n], and may equalize the raw data by using the second equilibrium coefficient α<0.5>. The error data err[n] is equivalent to a difference between the current data d[n] and the reference signal Vref. Alternatively, the error data err[n] reflects an amplitude of the current data d[n]. Therefore, the equalizer 110 may adaptively adjust an equilibrium coefficient based on the amplitude, to equalize raw data and generate data d to the phase detector 120.

This embodiment does not limit a manner of generating/updating the second equilibrium coefficient α<0.5> by the equalizer 110. For example, according to design requirements, the equalizer 110 may obtain the second equilibrium coefficient α<0.5> by using an adaptive algorithm. An example of the adaptive algorithm is as follows. For example, the equalizer 110 may select the current data d[n] complying with a preset pattern. The preset pattern may be determined according to design requirements. For example, the equalizer 110 may select a preset pattern whose d[n−1], d[n] and d[n+1] are 0, 1 and 1 (or 1, 0 and 0) respectively. d[n+1] indicates a next piece of data of the data d[n]. The equalizer 110 may adjust the second equilibrium coefficient α<0.5> by comparing a swing of d[n] and a value of the reference signal Vref.

For example, when the current data d[n] complying with the preset pattern is in an up state, if the current data d[n] is greater than a high-reference signal (for example, a reference signal Vref), the equalizer 110 may increase a second equilibrium coefficient α<0.5>. When the current data d[n] complying with the preset pattern is in the up state, if the current data d[n] is less than the high-reference signal (for example, the reference signal Vref), the equalizer 110 may decrease the second equilibrium coefficient α<0.5>.

Figure 5:
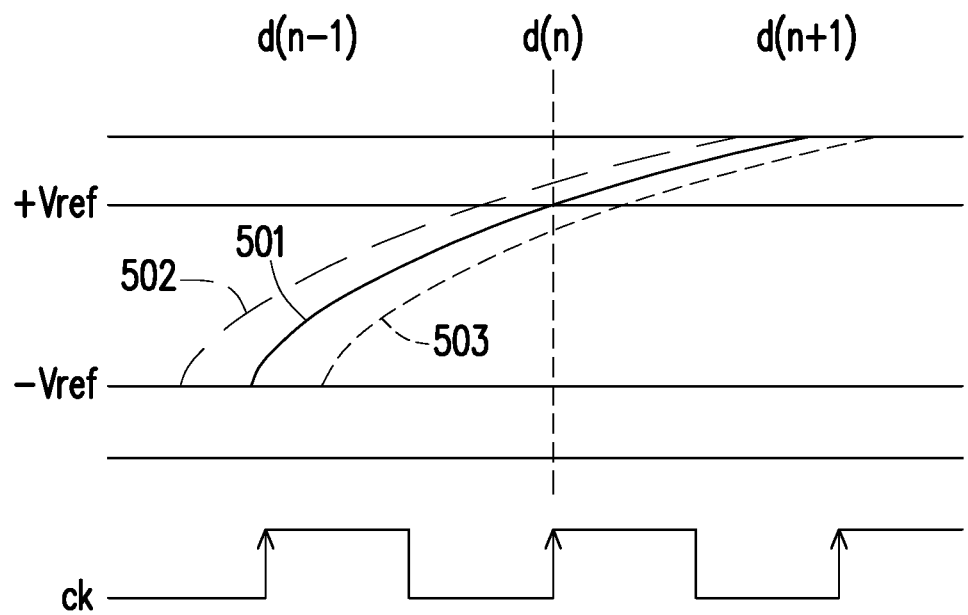
FIG. 5 is a schematic waveform view for describing raw data shown in FIG. 1 according to an embodiment of the present invention.

FIG. 5 is a schematic waveform view for describing the raw data D1 shown in FIG. 1 according to an embodiment of the present invention. As shown in FIG. 5, an abscissa axis indicates time, and an ordinate axis indicates an electrical level of a signal. FIG. 5 shows a waveform example of the raw data D1 when the raw data D1 complies with the preset pattern "011", that is, a current first piece of data d[n−1], current data d[n], and a next piece of data d[n+1] are 0, 1, and 1 respectively. A curve 501 shown in FIG. 5 indicates an ideal curve. If a voltage of the current data d[n] is greater than a reference signal Vref (referring to a curve 502 shown in FIG. 5), it indicates that inter-symbol interference (ISI) is great, and therefore, a second equilibrium coefficient α<0.5> may be increased (for example, 1 is added to the second equilibrium coefficient α<0.5>). On the contrary, if the voltage of the current data d[n] is less than the reference signal Vref (referring to a curve 503 shown in FIG. 5), it indicates that the inter-symbol interference is small, and therefore, the second equilibrium coefficient α<0.5> may be decreased (for example, 1 is subtracted from the second equilibrium coefficient α<0.5>).

Figure 6:
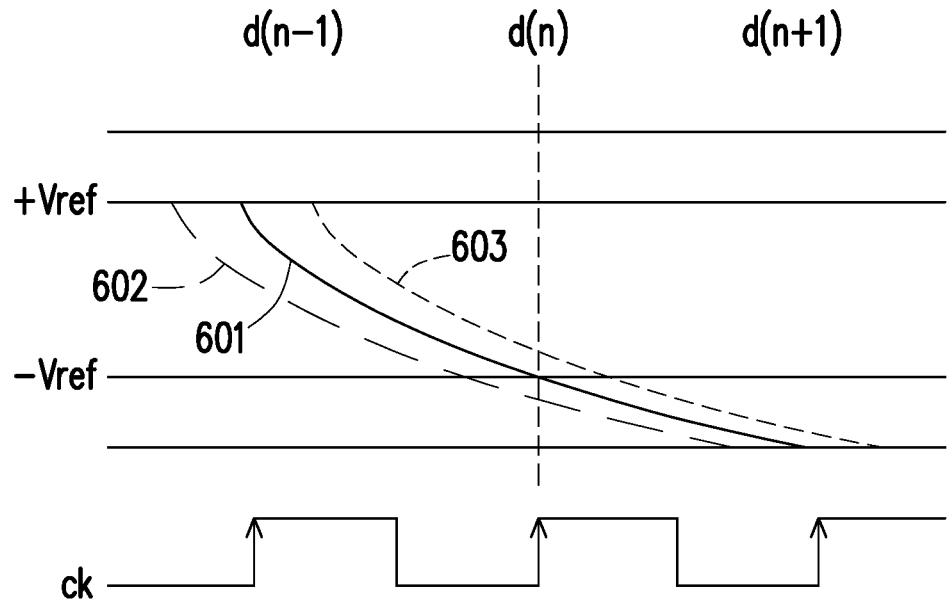
FIG. 6 is a schematic waveform view for describing raw data shown in FIG. 1 according to another embodiment of the present invention.

FIG. 6 is a schematic waveform view for describing the raw data D1 shown in FIG. 1 according to another embodiment of the present invention. As shown in FIG. 6, an abscissa axis indicates time, and an ordinate axis indicates an electrical level of a signal. FIG. 6 shows a waveform example of the raw data D1 when the raw data D1 complies with the preset pattern "100", that is, a current first piece of data d[n−1], current data d[n], and a next piece of data d[n+1] are 1, 0, and 0 respectively. A curve 601 shown in FIG. 6 indicates an ideal curve. If the voltage of the current data d[n] is less than a reference signal −Vref (referring to a curve 602 shown in FIG. 6), it indicates that inter-symbol interference (ISI) is great, and therefore, the second equilibrium coefficient α<0.5> may be increased (for example, 1 is added to the second equilibrium coefficient α<0.5>). On the contrary, if the voltage of the current data d[n] is greater than the reference signal −Vref (referring to a curve 603 shown in FIG. 6), it indicates that the inter-symbol interference is small, and therefore, the second equilibrium coefficient α<0.5> may be decreased (for example, 1 is subtracted from the second equilibrium coefficient α<0.5>).

When cases in FIG. 5 and FIG. 6 are comprehensively taken into consideration, an iterative formula of the second equilibrium coefficient α<0.5> is shown in the following equation (3). err[n] is a comparison result between the voltage of the current data d[n] and the reference signal Vref. If the error data err[n] is 1, sign(err[n]) is 1. If the error data err[n] is 0, sign(err[n]) is −1. If the current data d[n] is 1, sign(d[n]) is 1. If the current data d[n] is 0, sign(d[n]) is −1.

$$\text{when } d[n-1:n+1]=011 \text{ or } 100, |\alpha<0.5>|=|\alpha<0.5>|+ \text{sign}(err[n]) \cdot \text{sign}(d[n]), \quad \text{Equation (3)}$$

Figure 7:
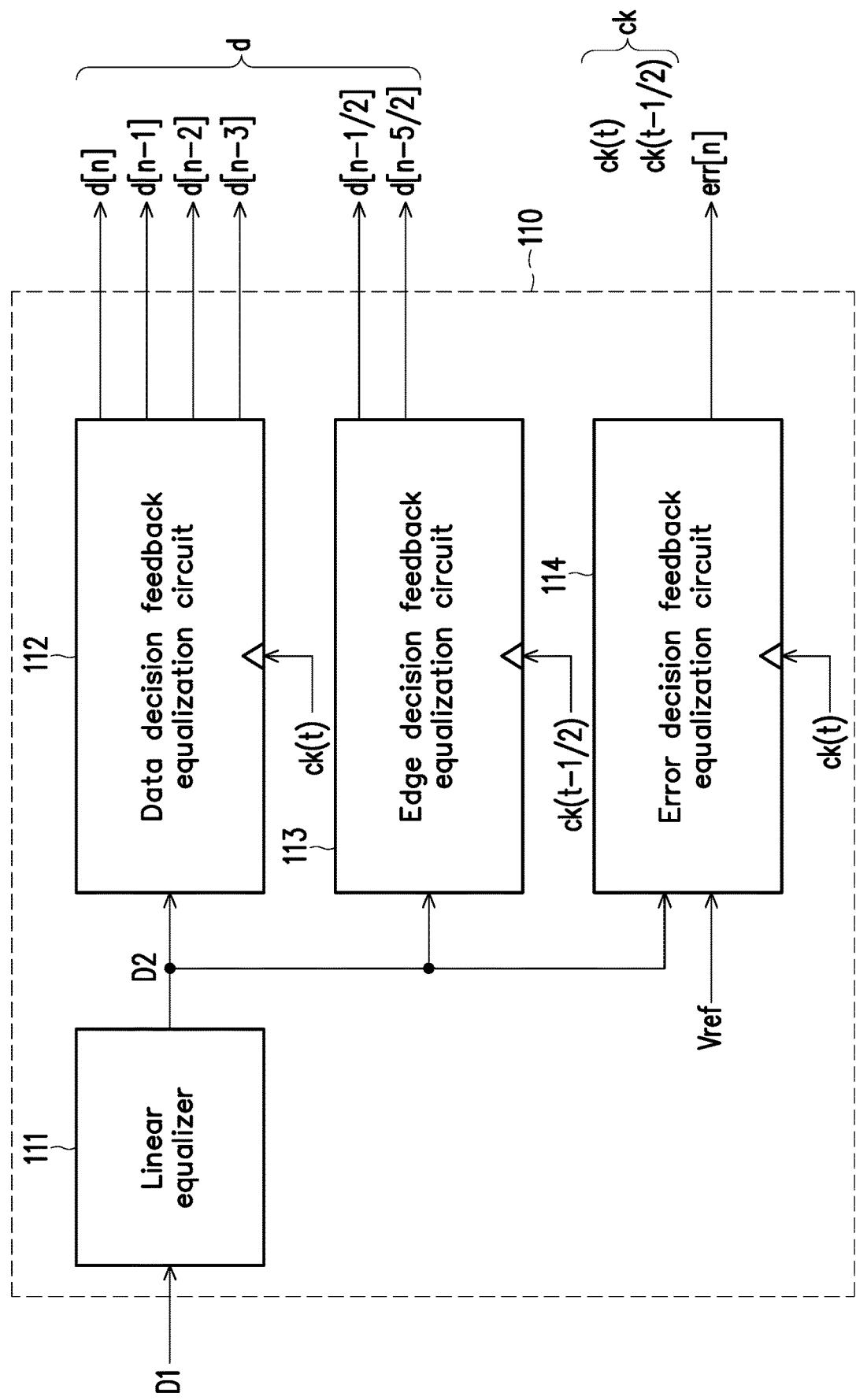
FIG. 7 is a schematic circuit block view for describing an equalizer shown in FIG. 1 according to an embodiment of the present invention.

FIG. 7 is a schematic circuit block view for describing the equalizer 110 shown in FIG. 1 according to an embodiment of the present invention. In an embodiment shown in FIG. 7, the equalizer 110 includes a linear equalizer 111, a data decision feedback equalization circuit 112 based on a loop-unrolling structure, an edge decision feedback equalization circuit 113 based on the loop-unrolling structure, and an error decision feedback equalization circuit 114 based on the loop-unrolling structure. The linear equalizer 111 may equalize the raw data D1 to generate processed data D2. This embodiment does not limit an implementation of the linear equalizer 111. For example, according to design requirements, the linear equalizer 111 may be a commonly known linear equalizer or another linear equalizer.

Figure 8:
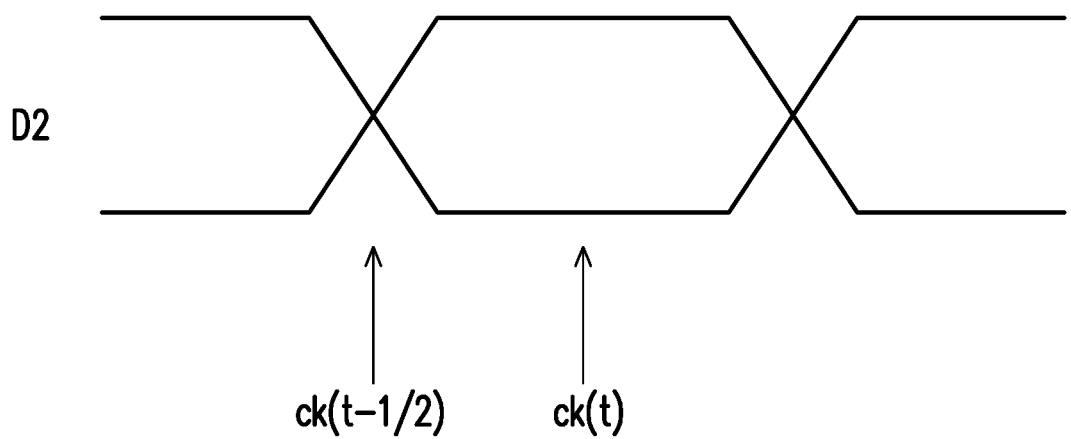
FIG. 8 is a schematic phase view for describing a clock signal ck(t) and a clock signal ck(t−1/2) shown in FIG. 7 according to an embodiment of the present invention.

In an embodiment shown in FIG. 7, a clock signal ck provided by an oscillation circuit 140 includes a clock signal ck(t) and a clock signal ck(t−1/2). The clock signal ck(t) may be used to sample data, and the clock signal ck(t−1/2) may be used to sample an edge. For example, FIG. 8 is a schematic phase view for describing the clock signal ck(t) and the clock signal ck(t−1/2) shown in FIG. 7 according to an embodiment of the present invention. In an embodiment shown in FIG. 8, triggered by the clock signal ck(t), the data decision feedback equalization circuit 112 may sample the processed data D2, to generate the current data d[n]. Triggered by the clock signal ck(t−1/2), the edge decision feedback equalization circuit 113 may sample an edge of the processed data D2, to generate edge data d[n−1/2].

The data decision feedback equalization circuit 112 is coupled to the linear equalizer 111 to receive the processed data D2. The data decision feedback equalization circuit 112 may equalize and sample the processed data D2 based on a loop-unrolling structure by using the first equilibrium coefficient α<1>, to generate the current data d[n], a previous first piece of data d[n−1], a previous second piece of data d[n−2], and a previous third piece of data d[n−3]. This embodiment does not limit an algorithm and an implementation of an equilibrium coefficient of the loop-unrolling structure. For example, according to design requirements, the algorithm of the equilibrium coefficient of the loop-unrolling structure may be a commonly known algorithm or another algorithm. The edge decision feedback equalization circuit 113 is coupled to the linear equalizer 111, to receive the processed data D2. The edge decision feedback equalization circuit 113 may equalize and sample the processed data D2 based on the loop-unrolling structure by using the second equilibrium coefficient α<0.5>, to generate edge data d[n−1/2] and edge data d[n−5/2]. The error decision feedback equalization circuit 114 is coupled to the linear equalizer 111, to receive the processed data D2. The error decision feedback equalization circuit 114 may equalize a difference between the processed data D2 and the reference signal Vref based on the loop-unrolling structure by using the first equilibrium coefficient α<1>, to generate the error data err[n].

Figure 9:
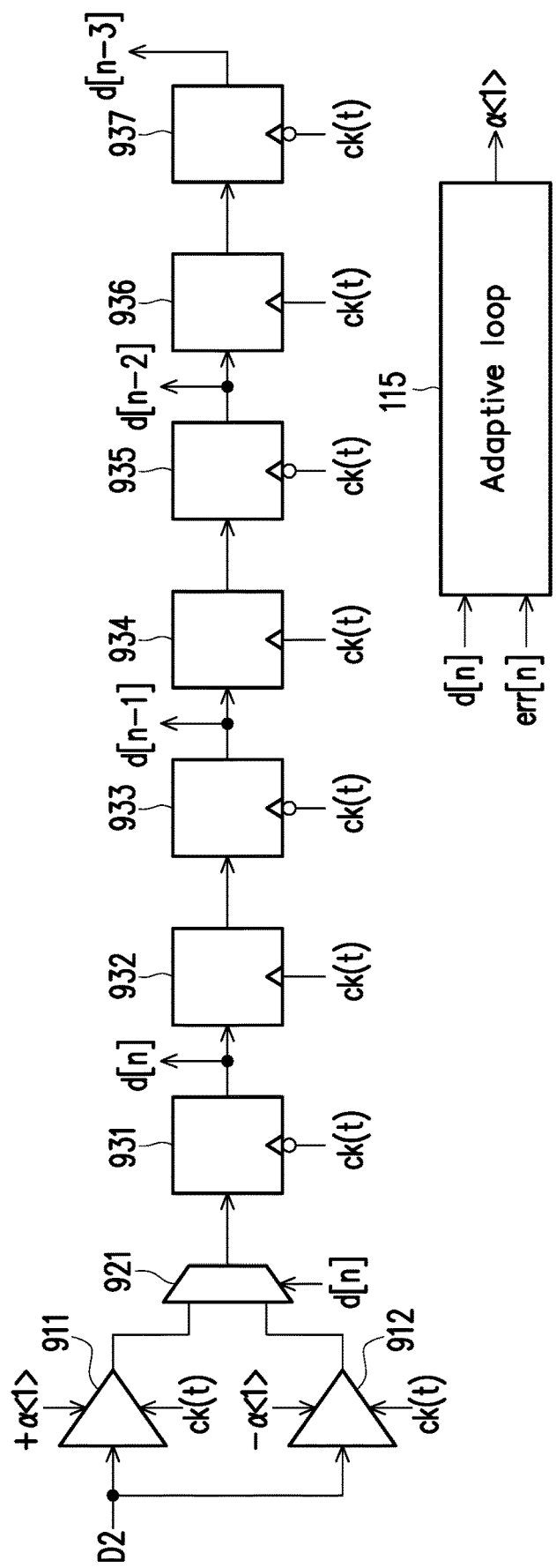
FIG. 9 is a schematic circuit block view for describing a data decision feedback equalization circuit shown in FIG. 7 according to an embodiment of the present invention.

FIG. 9 is a schematic circuit block view for describing the data decision feedback equalization circuit 112 shown in FIG. 7 according to an embodiment of the present invention. In an embodiment shown in FIG. 9, the data decision feedback equalization circuit 112 includes a decision device 911, a decision device 912, a multiplexer 921, a latch 931, a latch 932, a latch 933, a latch 934, a latch 935, a latch 936, and a latch 937. The decision device 911 and the decision device 912 are coupled to the linear equalizer 111 to receive the processed data D2. The decision device 911 checks whether a sum of the processed data D2 and the first equilibrium coefficient α<1> is greater than a threshold, to obtain a first check result. For example, when a sum of the processed data D2 and the first equilibrium coefficient α<1> is greater than 0 (a threshold), the decision device 911 outputs 1 (a first check result) to the multiplexer 921. When the sum of the processed data D2 and the first equilibrium coefficient α<1> is not greater than 0 (the threshold), the decision device 911 outputs 0 (the first check result) to the multiplexer 921. By analog, the decision device 912 checks whether a difference between the processed data D2 and the first equilibrium coefficient α<1> is greater than the threshold (for example, 0), to obtain a second check result.

A first selection terminal and a second selection terminal of the multiplexer 921 are respectively coupled to the decision device 911 and the decision device 912, to receive the first check result and the second check result. The multiplexer 921 is controlled by the current data d[n], to select to transmit the check result of either of the decision device 911 and the decision device 912 to the latch 931. An input terminal of the latch 931 is coupled to an output terminal of the multiplexer 921. Triggered by the clock signal ck(t), the latch 931 may generate the current data d[n]. An input terminal of the latch 932 is coupled to an output terminal of the latch 931. An input terminal of the latch 933 is coupled to an output terminal of the latch 932. Triggered by the clock signal ck(t), the latch 933 may generate the previous first piece of data d[n−1]. An input terminal of the latch 934 is coupled to an output terminal of the latch 933. An input terminal of the latch 935 is coupled to an output terminal of the latch 934. Triggered by the clock signal ck(t), the latch 935 may generate the previous second piece of data d[n−2]. An input terminal of the latch 936 is coupled to an output terminal of the latch 935. An input terminal of the latch 937 is coupled to an output terminal of the latch 936.

Triggered by the clock signal ck(t), the latch 937 may generate the previous third piece of data d[n−3].

In an embodiment shown in FIG. 9, the equalizer 110 further includes an adaptive loop 115. The adaptive loop 115 is coupled to the data decision feedback equalization circuit 112 to receive the current data d[n]. The adaptive loop 115 is further coupled to the error decision feedback equalization circuit 114 to receive the error data err[n]. The adaptive loop 115 updates the first equilibrium coefficient α<1> by using the current data d[n] and the error data err[n]. This embodiment does not limit an implementation of the adaptive loop 115. For example, according to design requirements, the adaptive loop 115 may be a commonly known adaptive loop or another adaptive loop circuit/algorithm.

Figure 10:
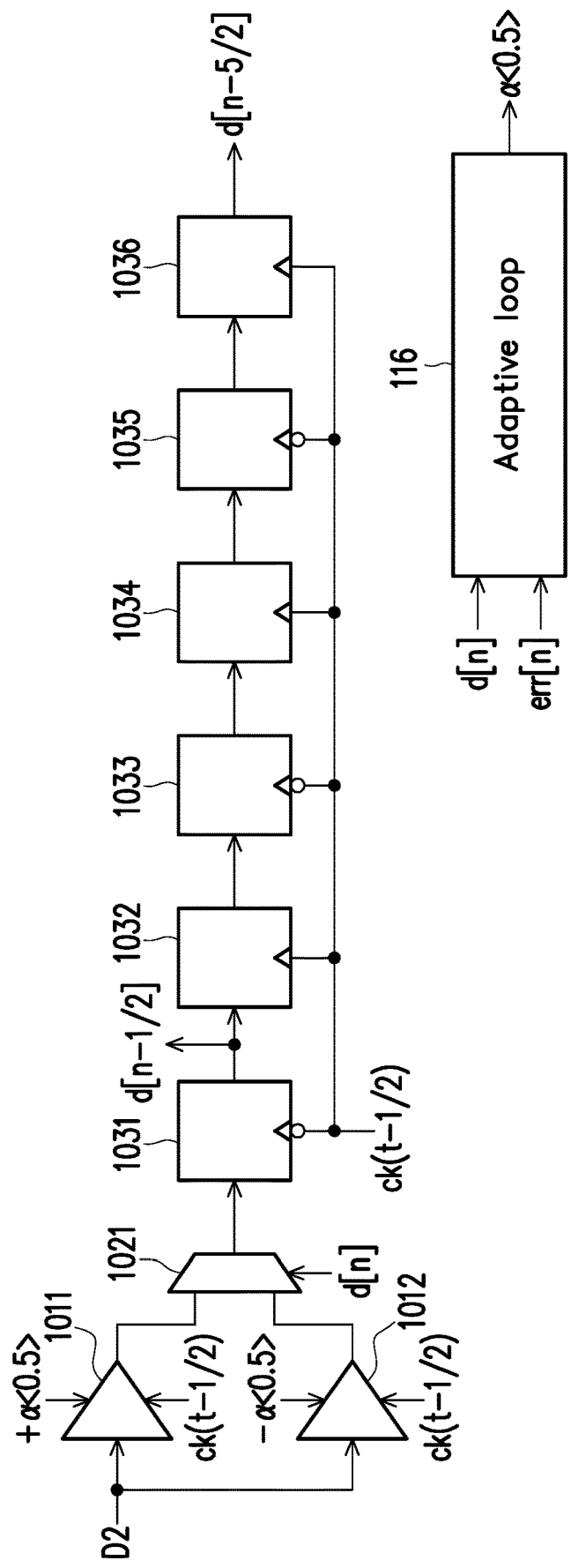
FIG. 10 is a schematic circuit block view for describing an edge decision feedback equalization circuit shown in FIG. 7 according to an embodiment of the present invention.

FIG. 10 is a schematic circuit block view for describing the edge decision feedback equalization circuit 113 shown in FIG. 7 according to an embodiment of the present invention. In an embodiment shown in FIG. 10, the edge decision feedback equalization circuit 113 includes a decision device 1011, a decision device 1012, a multiplexer 1021, a latch 1031, a latch 1032, a latch 1033, a latch 1034, a latch 1035, and a latch 1036. The decision device 1011 and the decision device 1012 are coupled to the linear equalizer 111 to receive the processed data D2. The decision device 1011 checks whether a sum of the processed data D2 and the second equilibrium coefficient α<0.5> is greater than a threshold, to obtain a first check result. For example, when the sum of the processed data D2 and the second equilibrium coefficient α<0.5> is greater than 0 (the threshold), the decision device 1011 outputs 1 (a first check result) to the multiplexer 1021. When the sum of the processed data D2 and the second equilibrium coefficient α<0.5> is not greater than 0 (the threshold), the decision device 1011 outputs 0 (a first check result) to the multiplexer 1021. By analog, the decision device 1012 checks whether a difference between the processed data D2 and the second equilibrium coefficient α<0.5> is greater than the threshold (for example, 0), to obtain a second check result.

A first selection terminal and a second selection terminal of the multiplexer 1021 are respectively coupled to the decision device 1011 and the decision device 1012, to receive the first check result and the second check result. The multiplexer 1021 is controlled by the current data d[n], to select to transmit the check result of either of the decision device 1011 and the decision device 1012 to the latch 1031. An input terminal of the latch 1031 is coupled to an output terminal of the multiplexer 1021. Triggered by the clock signal ck(t−1/2), the latch 1031 may generate the edge data d[n−1/2]. An input terminal of the latch 1032 is coupled to an output terminal of the latch 1031. An input terminal of the latch 1033 is coupled to an output terminal of the latch 1032. An input terminal of the latch 1034 is coupled to an output terminal of the latch 1033. An input terminal of the latch 1035 is coupled to an output terminal of the latch 1034. An input terminal of the latch 1036 is coupled to an output terminal of the latch 1035. Triggered by the clock signal ck(t−1/2), the latch 1036 may generate the edge data d[n−5/2] to the phase detector 120.

In an embodiment shown in FIG. 10, the equalizer 110 further includes an adaptive loop 116. The adaptive loop 116 is coupled to the data decision feedback equalization circuit 112 to receive the current data d[n]. The adaptive loop 116 is further coupled to the error decision feedback equalization circuit 114 to receive the error data err[n]. The adaptive loop 116 updates the second equilibrium coefficient α<0.5> by using the current data d[n] and the error data err[n].

This embodiment does not limit an implementation of the adaptive loop 116. For example, according to design requirements, the adaptive loop 116 may check whether a previous first piece of data d[n−1], current data d[n] and a next piece of data d[n+1] comply with a preset pattern. The preset pattern may be determined according to design requirements.

For example, the preset pattern may be 011 (for details, refer to related descriptions of FIG. 5). When the current data d[n] complying with the preset pattern is in an up state, if the current data d[n] is greater than a high-reference signal (for example, a reference signal Vref), the adaptive loop 116 may increase the second equilibrium coefficient α<0.5> (for example, 1 is added to the second equilibrium coefficient α<0.5>). When the current data d[n] complying with the preset pattern is in an up state, if the current data d[n] is less than the high-reference signal (for example, the reference signal Vref), the adaptive loop 116 may decrease the second equilibrium coefficient α<0.5> (for example, 1 is subtracted from the second equilibrium coefficient α<0.5>).

For another example, the preset pattern may be 100 (for details, refer to related descriptions of FIG. 6). When the current data d[n] complying with the preset pattern is in a down state, if the current data d[n] is less than a low-reference signal (for example, a reference signal −Vref), the adaptive loop 116 may increase the second equilibrium coefficient α<0.5> (for example, 1 is added to the second equilibrium coefficient α<0.5>). When the current data d[n] complying with the preset pattern is in a down state, if the current data d[n] is greater than the low-reference signal (for example, the reference signal −Vref), the adaptive loop 116 may decrease the second equilibrium coefficient α<0.5> (for example, 1 is subtracted from the second equilibrium coefficient α<0.5>).

Figure 11:
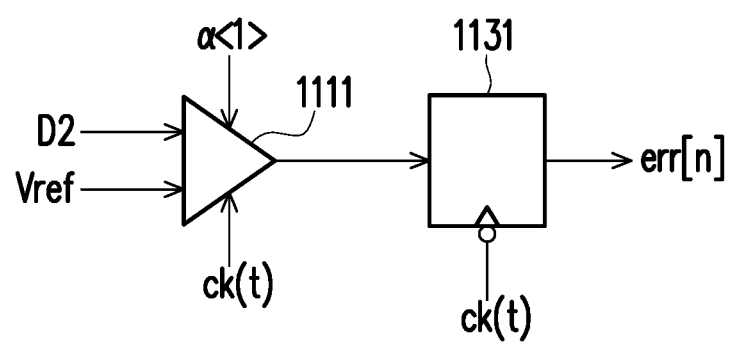
FIG. 11 is a schematic circuit block view for describing an error decision feedback equalization circuit shown in FIG. 7 according to an embodiment of the present invention.

FIG. 11 is a schematic circuit block view for describing the error decision feedback equalization circuit 114 shown in FIG. 7 according to an embodiment of the present invention. In an embodiment shown in FIG. 11, the error decision feedback equalization circuit 114 includes a decision device 1111 and a latch 1131. The decision device 1111 is coupled to the linear equalizer 111 to receive the processed data D2. The decision device 1111 checks whether a sum obtained in a manner in which the first equilibrium coefficient α<1> is added to or subtracted from a difference between the processed data D2 and the reference signal Vref is greater than a threshold, to obtain a check result. For example, when a sum obtained in a manner in which the first equilibrium coefficient α<1> is added to a difference between the processed data D2 and the reference signal Vref is greater than 0 (a threshold), the decision device 1111 outputs 1 (a check result) to the latch 1131, and when a sum obtained in a manner in which the first equilibrium coefficient α<1> is added to the difference between the processed data D2 and the reference signal Vref is not greater than 0 (the threshold), the decision device 1011 outputs 0 (a check result) to the latch 1131. An input terminal of the latch 1131 is coupled to an output terminal of the decision device 1011 to receive the check result. Triggered by the clock signal ck(t), the latch 1131 may generate the error data err[n].

Finally, it should be noted that the above embodiments are merely intended for describing the technical solutions of the present invention, other than limiting the present invention. Although the present invention is described in detail with reference to the foregoing embodiments, persons of ordinary skill in the art should understand that they may still make modifications to the technical solutions described in the foregoing embodiments, or make equivalent substitutions to some or all the technical features thereof, without departing from the spirit and scope of the technical solutions of the embodiments of the present invention.

What is claimed is:

1. A clock data recovery apparatus, comprising:
an equalizer, configured to equalize raw data to generate equalized data;
a phase detector, coupled to the equalizer to receive the equalized data, and configured to generate a detection result according to the equalized data, wherein the phase detector performs pattern-filtering on the equalized data to filter out at least one pattern;
a charge pump, coupled to the phase detector to receive the detection result, and configured to generate a control signal according to the detection result; and
an oscillation circuit, coupled to the charge pump to receive the control signal, and configured to generate a clock signal according to the control signal,
wherein the detection result comprises a first detection result Sup, the phase detector calculates Sup=(d[n−5/2]^d[n−3])*(tf[0]|(d[n−3]^d[n−2]))*(tf[1]|(d[n−2]^d[n−1]))*(tf[2]|(d[n−1]^d[n])) to obtain the first detection result Sup, wherein ^ is an XOR operand, * is an AND operand, | is an OR operand, d[n] indicates current data of the equalized data, d[n−1] indicates a previous first piece of data of the equalized data, d[n−2] indicates a previous second piece of data of the equalized data, d[n−3] indicates a previous third piece of data of the equalized data, d[n−5/2] indicates edge data of the equalized data between the previous second piece of data d[n−2] and the previous third piece of data d[n−3], and tf[0], tf[1] and tf[2] indicate different bits of pattern selection signals.

2. The clock data recovery apparatus according to claim 1, wherein the detection result further comprises a second detection result Sdn, the phase detector calculates Sdn=(d[n−2]^d[n−5/2])*(tf[0]|(d[n−3]^d[n−2]))*(tf[1]|(d[n−2]^d[n−1]))*(tf[2]|(d[n−1]^d[n])) to obtain the second detection result Sdn, wherein ^ is an XOR operand, * is an AND operand, | is an OR operand, d[n] indicates current data of the equalized data, d[n−1] indicates a previous first piece of data of the equalized data, d[n−2] indicates a previous second piece of data of the equalized data, d[n−3] indicates a previous third piece of data of the equalized data, d[n−5/2] indicates edge data of the equalized data between the previous second piece of data d[n−2] and the previous third piece of data d[n−3], and tf[0], tf[1] and tf[2] indicate different bits of pattern selection signals.

3. The clock data recovery apparatus according to claim 1, wherein the phase detector comprises:
a first XOR gate, comprising a first input terminal coupled to the equalizer to receive the current data d[n] of the equalized data, wherein a second input terminal of the first XOR gate is coupled to the equalizer to receive a previous first piece of data d[n−1] of the equalized data;
a second XOR gate, comprising a first input terminal coupled to the equalizer to receive the previous first piece of data d[n−1], wherein a second input terminal of the second XOR gate is coupled to the equalizer to receive a previous second piece of data d[n−2] of the equalized data;
a third XOR gate, comprising a first input terminal coupled to the equalizer to receive the previous second piece of data d[n−2], wherein a second input terminal of the third XOR gate is coupled to the equalizer to receive a previous third piece of data d[n−3] of the equalized data;
a fourth XOR gate, comprising a first input terminal coupled to the equalizer to receive the previous third piece of data d[n−3], wherein a second input terminal of the fourth XOR gate is coupled to the equalizer to receive edge data d[n−5/2] of the equalized data between the previous second piece of data d[n−2] and the previous third piece of data d[n−3];
a fifth XOR gate, comprising a first input terminal coupled to the equalizer to receive the edge data d[n−5/2], wherein a second input terminal of the fifth XOR gate is coupled to the equalizer to receive the previous second piece of data d[n−2];
a first OR gate, comprising a first input terminal to receive a first bit tf[2] of a pattern selection signal, wherein a second input terminal of the first OR gate is coupled to an output terminal of the first XOR gate;
a second OR gate, comprising a first input terminal to receive a second bit tf[1] of the pattern selection signal, wherein a second input terminal of the second OR gate is coupled to an output terminal of the second XOR gate;
a third OR gate, comprising a first input terminal to receive a third bit tf[0] of the pattern selection signal, wherein a second input terminal of the third OR gate is coupled to an output terminal of the third XOR gate;
a fourth OR gate, comprising a first input terminal and a second input terminal coupled to an output terminal of the fourth XOR gate;
a fifth OR gate, comprising a first input terminal and a second input terminal coupled to an output terminal of the fifth XOR gate;
a first AND gate, comprising a first input terminal coupled to an output terminal of the first OR gate, wherein a second input terminal of the first AND gate is coupled to an output terminal of the second OR gate, a third input terminal of the first AND gate is coupled to an output terminal of the third OR gate, a fourth input terminal of the first AND gate is coupled to an output terminal of the fourth OR gate, and an output terminal of the first AND gate outputs a first detection result Sup of the detection result; and
a second AND gate, comprising a first input terminal coupled to the output terminal of the first OR gate, wherein a second input terminal of the second AND gate is coupled to the output terminal of the second OR gate, a third input terminal of the second AND gate is coupled to the output terminal of the third OR gate, a fourth input terminal of the second AND gate is coupled to an output terminal of the fifth OR gate, and an output terminal of the second AND gate outputs a second detection result Sdn of the detection result.

4. The clock data recovery apparatus according to claim 1, wherein the equalizer equalizes the raw data based on a loop-unrolling structure by using a first equilibrium coefficient, to generate current data of the equalized data; the equalizer equalizes the raw data based on the loop-unrolling structure by using a second equilibrium coefficient, to generate first edge data of the equalized data; the equalizer equalizes the raw data based on the loop-unrolling structure by using the first equilibrium coefficient, to generate error data of a difference between the equalized data and a reference signal; the equalizer updates the first equilibrium coefficient by using the current data and the error data; and the equalizer updates the second equilibrium coefficient by using the current data and the error data.

5. The clock data recovery apparatus according to claim 4, wherein the equalizer comprises:

a linear equalizer, configured to equalize the raw data to generate processed data;
a data decision feedback equalization circuit, coupled to the linear equalizer to receive the processed data, wherein the data decision feedback equalization circuit equalizes the processed data based on the loop-unrolling structure by using the first equilibrium coefficient, to generate the current data;
an edge decision feedback equalization circuit, coupled to the linear equalizer to receive the processed data, wherein the edge decision feedback equalization circuit equalizes the processed data based on the loop-unrolling structure by using the second equilibrium coefficient, to generate the first edge data; and
an error decision feedback equalization circuit, coupled to the linear equalizer to receive the processed data, wherein the error decision feedback equalization circuit equalizes a difference between the processed data and the reference signal based on the loop-unrolling structure by using the first equilibrium coefficient, to generate the error data.

6. The clock data recovery apparatus according to claim 5, wherein the equalizer further comprises:
a first adaptive loop, coupled to the data decision feedback equalization circuit to receive the current data, and coupled to the error decision feedback equalization circuit to receive the error data, wherein the first adaptive loop updates the first equilibrium coefficient by using the current data and the error data; and
a second adaptive loop, coupled to the data decision feedback equalization circuit to receive the current data, and coupled to the error decision feedback equalization circuit to receive the error data, wherein the second adaptive loop updates the second equilibrium coefficient by using the current data and the error data.

7. The clock data recovery apparatus according to claim 6, wherein
the second adaptive loop checks whether the current data complies with a preset pattern;
when the current data complying with the preset pattern s in an up state, the second adaptive loop increases the second equilibrium coefficient if the current data is greater than a high-reference signal, and the second adaptive loop decreases the second equilibrium coefficient if the current data is less than the high-reference signal; and
when the current data complying with the preset pattern is in a down state, the second adaptive loop increases the second equilibrium coefficient if the current data is less than a low-reference signal, and the second adaptive loop decreases the second equilibrium coefficient if the current data is greater than the low-reference signal.

8. The clock data recovery apparatus according to claim 5, wherein the data decision feedback equalization circuit comprises:
a first decision device, coupled to the linear equalizer to receive the processed data, wherein the first decision device checks whether a sum of the processed data and the first equilibrium coefficient is greater than a threshold, to obtain a first check result;
a second decision device, coupled to the linear equalizer to receive the processed data, wherein the second decision device checks whether a difference between the processed data and the first equilibrium coefficient is greater than the threshold, to obtain a second check result;
a multiplexer, comprising a first selection terminal and a second selection terminal respectively coupled to the first decision device and the second decision device to receive the first check result and the second check result; and
a latch, coupled to an output terminal of the multiplexer, and configured to generate the current data.

9. The clock data recovery apparatus according to claim 5, wherein the edge decision feedback equalization circuit comprises:
a first decision device, coupled to the linear equalizer to receive the processed data, wherein the first decision device checks whether a sum of the processed data and the second equilibrium coefficient is greater than a threshold, to obtain a first check result;
a second decision device, coupled to the linear equalizer to receive the processed data, wherein the second decision device checks whether a difference between the processed data and the second equilibrium coefficient is greater than the threshold, to obtain a second check result;
a multiplexer, comprising a first selection terminal and a second selection terminal respectively coupled to the first decision device and the second decision device to receive the first check result and the second check result; and
a latch, coupled to an output terminal of the multiplexer, and configured to generate the first edge data.

10. The clock data recovery apparatus according to claim 5, wherein the error decision feedback equalization circuit comprises:
a decision device, coupled to the linear equalizer to receive the processed data, wherein the decision device checks whether a sum of the first equilibrium coefficient and a difference between the processed data and the reference signal is greater than a threshold or whether a difference between the first equilibrium coefficient and the difference between the processed data and the reference signal is greater than the threshold, to obtain a check result; and
a latch, coupled to the decision device to receive the check result, and configured to generate the error data.

11. An operation method for a clock data recovery apparatus, comprising:
equalizing, by an equalizer, raw data to generate equalized data;
generating, by a phase detector, a detection result according to the equalized data, wherein the phase detector performs pattern-filtering on the equalized data to filter out at least one pattern;
generating, by a charge pump, a control signal according to the detection result; and
generating, by an oscillation circuit, a clock signal according to the control signal,
wherein the detection result comprises a first detection result Sup, and the operation method further comprises:
calculating, by the phase detector, $Sup=(d[n-5/2]\hat{}d[n-3])*(tf[0]|(d[n-3]\hat{}d[n-2]))*(tf[1]|(d[n-2]\hat{}d[n-1]))*(tf[2]|(d[n-1]\hat{}d[n]))$ to obtain the first detection result Sup,
wherein $\hat{}$ is an XOR operand, * is an AND operand, | is an OR operand, d[n] indicates current data of the equalized data, d[n−1] indicates a previous first piece of data of the equalized data, d[n−2] indicates a previous second piece of data of the equalized data, d[n−3] indicates a previous third piece of data of the equalized data, d[n−5/2] indicates edge data of the equalized data between the previous second piece of data d[n−2] and the previous third piece of data d[n−3], and tf[0], tf[1] and tf[2] indicate different bits of a pattern selection signal.

12. The operation method according to claim 11, wherein the detection result further comprises a second detection result Sdn, and the operation method further comprises:

calculating, by the phase detector, Sdn=(d[n−2]^d[n−5/2])*(tf[0]|(d[n−3]^d[n−2]))*(tf[1]|(d[n−2]^d[n−1]))*(tf[2]|(d[n−1]^d[n])), to obtain the second detection result Sdn, wherein ^ is an XOR operand, * is an AND operand, | is an OR operand, d[n] indicates current data of the equalized data, d[n−1] indicates a previous first piece of data of the equalized data, d[n−2] indicates a previous second piece of data of the equalized data, d[n−3] indicates a previous third piece of data of the equalized data, d[n−5/2] indicates edge data of the equalized data between the previous second piece of data d[n−2] and the previous third piece of data d[n−3], and tf[0], tf[1] and tf[2] indicate different bits of a pattern selection signal.

13. The operation method according to claim 11, further comprising:

equalizing, by the equalizer, the raw data based on a loop-unrolling structure by using a first equilibrium coefficient, to generate current data of the equalized data; and equalizing, by the equalizer, the raw data based on the loop-unrolling structure by using a second equilibrium coefficient, to generate first edge data of the equalized data;

equalizing, by the equalizer, the raw data based on the loop-unrolling structure by using the first equilibrium coefficient, to generate error data of a difference between the equalized data and a reference signal;

updating, by the equalizer, the first equilibrium coefficient by using the current data and the error data; and updating, by the equalizer, the second equilibrium coefficient by using the current data and the error data.

14. The operation method according to claim 13, further comprising:

equalizing, by a linear equalizer, the raw data to generate processed data;

equalizing, by a data decision feedback equalization circuit, the processed data based on the loop-unrolling structure by using the first equilibrium coefficient, to generate the current data;

equalizing, by an edge decision feedback equalization circuit, the processed data based on the loop-unrolling structure by using the second equilibrium coefficient, to generate the first edge data; and equalizing, by an error decision feedback equalization circuit, a difference between the processed data and the reference signal based on the loop-unrolling structure by using the first equilibrium coefficient, to generate the error data.

15. The operation method according to claim 14, further comprising:

updating, by a first adaptive loop, the first equilibrium coefficient by using the current data and the error data; and updating, by a second adaptive loop, the second equilibrium coefficient by using the current data and the error data.

16. The operation method according to claim 15, further comprising:

checking, by the second adaptive loop, whether the current data complies with a preset pattern;

when the current data complying with the preset pattern is in an up state, increasing the second equilibrium coefficient if the current data is greater than a high-reference signal, and decreasing the second equilibrium coefficient if the current data is less than the high-reference signal; and when the current data complying with the preset pattern is in a down state, increasing the second equilibrium coefficient if the current data is less than a low-reference signal, and decreasing the second equilibrium coefficient if the current data is greater than the low-reference signal.

17. A clock data recovery apparatus, comprising:

an equalizer, configured to equalize raw data to generate equalized data, wherein the equalizer equalizes the raw data based on a loop-unrolling structure by using a first equilibrium coefficient, to generate current data of the equalized data; the equalizer equalizes the raw data based on the loop-unrolling structure by using a second equilibrium coefficient, to generate first edge data of the equalized data; the equalizer equalizes the raw data based on the loop-unrolling structure by using the first equilibrium coefficient, to generate error data of a difference between the equalized data and a reference signal; the equalizer updates the first equilibrium coefficient by using the current data and the error data; and the equalizer updates the second equilibrium coefficient by using the current data and the error data;

a phase detector, coupled to the equalizer to receive the equalized data, and configured to generate a detection result according to the equalized data;

a charge pump, coupled to the phase detector to receive the detection result, and configured to generate a control signal according to the detection result; and an oscillation circuit, coupled to the charge pump to receive the control signal, and configured to generate a clock signal according to the control signal.

18. The clock data recovery apparatus according to claim 17, wherein the equalizer comprises:

a linear equalizer, configured to equalize the raw data to generate processed data;

a data decision feedback equalization circuit, coupled to the linear equalizer to receive the processed data, wherein the data decision feedback equalization circuit equalizes the processed data based on the loop-unrolling structure by using the first equilibrium coefficient, to generate the current data;

an edge decision feedback equalization circuit, coupled to the linear equalizer to receive the processed data, wherein the edge decision feedback equalization circuit equalizes the processed data based on the loop-unrolling structure by using the second equilibrium coefficient, to generate the first edge data; and an error decision feedback equalization circuit, coupled to the linear equalizer to receive the processed data, wherein the error decision feedback equalization circuit equalizes a difference between the processed data and the reference signal based on the loop-unrolling structure by using the first equilibrium coefficient, to generate the error data.

19. The clock data recovery apparatus according to claim 18, wherein the equalizer further comprises:

a first adaptive loop, coupled to the data decision feedback equalization circuit to receive the current data, and coupled to the error decision feedback equalization circuit to receive the error data, wherein the first adaptive loop updates the first equilibrium coefficient by using the current data and the error data; and a second adaptive loop, coupled to the data decision feedback equalization circuit to receive the current data, and coupled to the error decision feedback equalization circuit to receive the error data, wherein the second adaptive loop updates the second equilibrium coefficient by using the current data and the error data.

20. The clock data recovery apparatus according to claim 19, wherein the second adaptive loop checks whether the current data complies with a preset pattern;

when the current data complying with the preset pattern is in an up state, the second adaptive loop increases the second equilibrium coefficient if the current data is greater than a high-reference signal, and the second adaptive loop decreases the second equilibrium coefficient if the current data is less than the high-reference signal; and when the current data complying with the preset pattern is in a down state, the second adaptive loop increases the second equilibrium coefficient if the current data is less than a low-reference signal, and the second adaptive loop decreases the second equilibrium coefficient if the current data is greater than the low-reference signal.

21. The clock data recovery apparatus according to claim 18, wherein the data decision feedback equalization circuit comprises:

a first decision device, coupled to the linear equalizer to receive the processed data, wherein the first decision device checks whether a sum of the processed data and the first equilibrium coefficient is greater than a threshold, to obtain a first check result;

a second decision device, coupled to the linear equalizer to receive the processed data, wherein the second decision device checks whether a difference between the processed data and the first equilibrium coefficient is greater than the threshold, to obtain a second check result;

a multiplexer, comprising a first selection terminal and a second selection terminal respectively coupled to the first decision device and the second decision device to receive the first check result and the second check result; and a latch, coupled to an output terminal of the multiplexer, and configured to generate the current data.

22. The clock data recovery apparatus according to claim 18, wherein the edge decision feedback equalization circuit comprises:

a first decision device, coupled to the linear equalizer to receive the processed data, wherein the first decision device checks whether a sum of the processed data and the second equilibrium coefficient is greater than a threshold, to obtain a first check result;

a second decision device, coupled to the linear equalizer to receive the processed data, wherein the second decision device checks whether a difference between the processed data and the second equilibrium coefficient is greater than the threshold, to obtain a second check result;

a multiplexer, comprising a first selection terminal and a second selection terminal respectively coupled to the first decision device and the second decision device to receive the first check result and the second check result; and a latch, coupled to an output terminal of the multiplexer, and configured to generate the first edge data.

23. The clock data recovery apparatus according to claim 18, wherein the error decision feedback equalization circuit comprises:

a decision device, coupled to the linear equalizer to receive the processed data, wherein the decision device checks whether a sum of the first equilibrium coefficient and a difference between the processed data and the reference signal is greater than a threshold or whether a difference between the first equilibrium coefficient and the difference between the processed data and the reference signal is greater than the threshold, to obtain a check result; and a latch, coupled to the decision device to receive the check result, and configured to generate the error data.

24. An operation method for a clock data recovery apparatus, comprising:

equalizing, by an equalizer, raw data based on a loop-unrolling structure by using a first equilibrium coefficient, to generate current data of equalized data;

equalizing, by the equalizer, the raw data based on the loop-unrolling structure by using a second equilibrium coefficient, to generate first edge data of the equalized data;

equalizing, by the equalizer, the raw data based on the loop-unrolling structure by using the first equilibrium coefficient, to generate error data of a difference between the equalized data and a reference signal;

updating, by the equalizer, the first equilibrium coefficient by using the current data and the error data;

updating, by the equalizer, the second equilibrium coefficient by using the current data and the error data;

generating, by a phase detector, a detection result according to the equalized data;

generating, by a charge pump, a control signal according to the detection result; and generating, by an oscillation circuit, a clock signal according to the control signal.

25. The operation method according to claim 24, further comprising:

equalizing, by a linear equalizer, the raw data to generate processed data;

equalizing, by a data decision feedback equalization circuit, the processed data based on the loop-unrolling structure by using the first equilibrium coefficient, to generate the current data;

equalizing, by an edge decision feedback equalization circuit, the processed data based on the loop-unrolling structure by using the second equilibrium coefficient, to generate the first edge data; and equalizing, by an error decision feedback equalization circuit, a difference between the processed data and the reference signal based on the loop-unrolling structure by using the first equilibrium coefficient, to generate the error data.

26. The operation method according to claim 25, further comprising:

updating, by a first adaptive loop, the first equilibrium coefficient by using the current data and the error data; and updating, by a second adaptive loop, the second equilibrium coefficient by using the current data and the error data.

27. The operation method according to claim 26, further comprising:

checking, by the second adaptive loop, whether the current data complies with a preset pattern;

when the current data complying with the preset pattern is in an up state, increasing the second equilibrium coefficient if the current data is greater than a high-reference signal, and decreasing the second equilibrium coefficient if the current data is less than the high-reference signal; and when the current data complying with the preset pattern is in a down state, increasing the second equilibrium coefficient if the current data is less than a low-reference signal, and decreasing the second equilibrium coefficient if the current data is greater than the low-reference signal.

* * * * *